United States Patent [19]

Nakamura et al.

[11] Patent Number: 5,117,111

[45] Date of Patent: May 26, 1992

[54] ELECTRON BEAM MEASURING APPARATUS

[75] Inventors: Kazumitsu Nakamura, Katsuta; Shinichi Kato, Mito; Yoshio Sakitani, Ooarai; Yoshihisa Minamikawa, Katsuta, all of Japan

[73] Assignee: Hitachi, Ltd., Tokyo, Japan

[21] Appl. No.: 717,500

[22] Filed: Jun. 19, 1991

[30] Foreign Application Priority Data

Jun. 27, 1990 [JP] Japan .................................. 2-166732

[51] Int. Cl.⁵ .......................................... H01J 37/256
[52] U.S. Cl. .................................. 250/310; 250/306; 250/307
[58] Field of Search ............... 250/310, 492.2, 396 R, 250/492.23, 492.3, 307, 306

[56] References Cited

U.S. PATENT DOCUMENTS 4,791,295  12/1988  Yamada .............................. 250/307

Primary Examiner—Jack I. Berman
Assistant Examiner—Kiet T. Nguyen
Attorney, Agent, or Firm—Antonelli, Terry, Stout & Kraus

[57] ABSTRACT

An electron beam measuring apparatus for measuring size of pattern on surface of a specimen comprising, an electron gun, an electron lens for focusing the electron beam from the electron gun on the specimen surface, a deflector for deflecting the electron beam, a spot control means for forming a flat edge portion in the electron beam spot, a rotation coil for rotating the electron beam so that the flat portion of the electron beam spot becomes to be perpendicular to the scanning direction of the electron beam, a detecting means for detecting secondary electrons reflected from the specimen surface, and a computer for calculating the size of the pattern based on the secondary electrons from the detecting means. As the flat portion of the electron beam spot is perpendicular to the scanning direction, the size of pattern is measured with high accuracy.

9 Claims, 5 Drawing Sheets

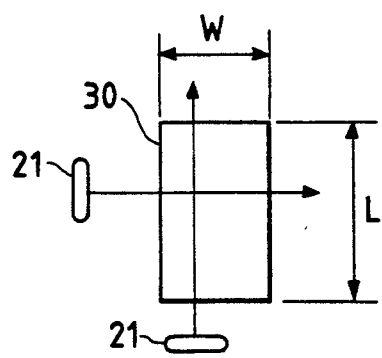
FIG. 2A
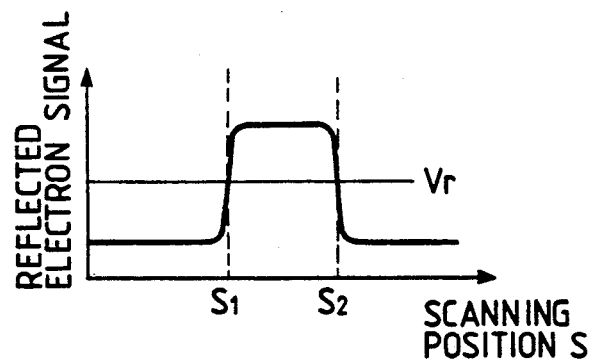
FIG. 2B
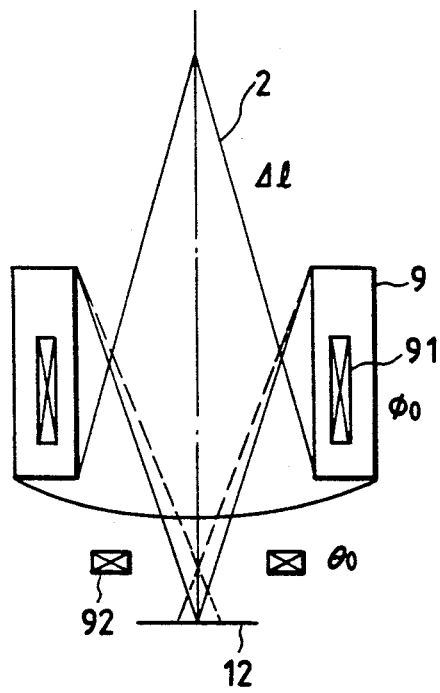
FIG. 3A
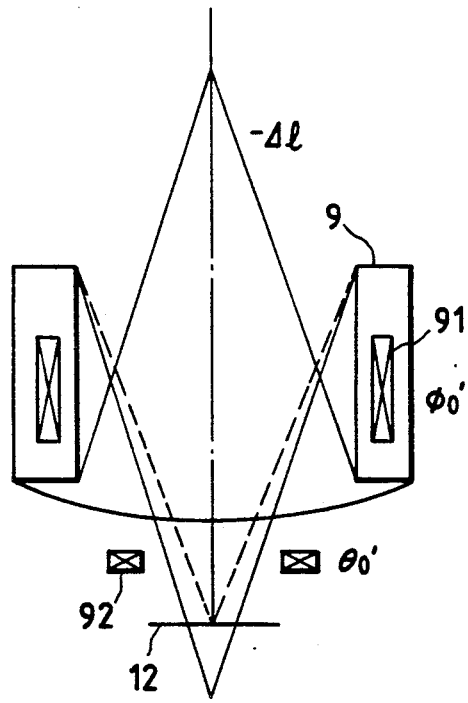
FIG. 3B
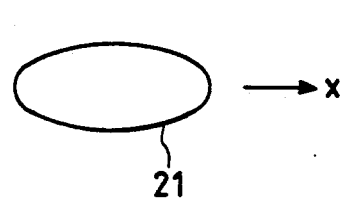
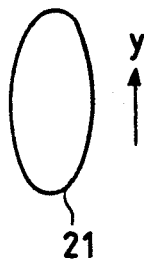

ELECTRON BEAM MEASURING APPARATUS

BACKGROUND OF THE INVENTION

The present invention relates to an apparatus for measuring the size of fine patterns formed on semiconductor wafers by an electron beam and more specifically to an electron beam measuring apparatus which prevents contamination of wafer surface and improves the precision of measurement.

In improving the measuring accuracy, conventional electron beam measuring apparatuses take such measures as increasing the electron beam current and constricting the beam.

However, as the current density of an electron beam increases, resist patterns and patterns made by some processes on the surface of a semiconductor wafer that are to be measured are damaged. For this reason, as described in the Japanese Patent Laid-Open Nos. 15604/1989 and 31008/1989, one or two rectangular apertures are used to shape the cross section of an electron beam into a rectangle, and the narrow linear electron beam thus shaped (referred to as a linear beam hereafter) is directed parallel to the edges of various patterns and sweeps across them. Secondary electrons or reflected electrons that are produced during the beam scanning are detected to measure the distance between edges.

FIGS. 2A and 2B show the relationship between such patterns and the linear beams As shown in FIG. 2A, when the linear beam 21 sweeps laterally across a pattern 30 on a specimen, the secondary or reflected electrons from the specimen are detected to produce a reflected electron signal shown in FIG. 2B. The reflected electron signal is compared with a reference level $V_r$ to determine the width W of the pattern 30.

Similarly, the length L of the pattern 30 can be measured by deflecting the linear beam spot 21 vertically.

The accuracy of measurement improves as the width of a linear beam spot becomes smaller and the electron beam current increases. The current density of the beam can be reduced by elongating the spot. That is, when the spot is shaped into a narrower and longer spot and then moved in the width direction, the current density decreases, preventing damage on the patterns while at the same time improving the measurement accuracy.

In the case of this kind of linear beams, however, it is required to change the direction of the linear beam according to the direction of the edges of the pattern 30 to be detected.

In conventional apparatuses, since the elongate electron beam is changed in direction so that the longer side of the spot matches with the pattern edges to be measured, a slit direction adjusting mechanism is provided in a vacuum vessel to enable the slit to be changed in the direction and shape by operation from outside the vacuum vessel.

However, installation inside the vacuum vessel of the slit direction adjusting mechanism having movable parts gives rise to a problem of contaminated vacuum.

SUMMARY OF THE INVENTION

An object of this invention is to provide an electron beam measuring apparatus which can change the shape and direction of the electron beam spot arbitrarily without contaminating the vacuum vessel interior.

To achieve the above objective, the invention employs a spot controller which is virtually an astigmatism adjusting apparatus to shape the electron beam spot into a linear one and rotate it by a rotation coil.

With the spot controller, two focal points lying on two planes which are perpendicular to each other and include the center axis of the beam are made apart from each other.

The rotation coil includes at least a pair of coils and adjusts the strength and direction of the magnetic field produced by these coils to rotate the linear beam spot.

The linear beam spot sweeps the pattern surface formed on the specimen a plurality of times to produce reflected electron signals, and the maximum differential value of the reflected electron signals is detected to determine the width and direction of the linear beam spot.

To describe in more detail, the electron beam is repetitively moved while changing at least one of the two focal points, and the maximum differential value of the reflected electron signals is automatically detected.

Likewise, the linear beam spot is rotated by the rotation coil while being repetitively deflected to automatically detect the maximum differential value of the reflected electron signals.

Further, the measured values of pattern width or pattern edge position obtained by the repetitive scanning are averaged.

The electron beam measuring apparatus of this invention with the configuration mentioned above shapes the electron beam spot into a linear one and positions it so that its longer side faces the pattern edge.

Shaping the electron beam spot into an elongate one is done by shifting from each other the positions of two focal points lying on two planes which are perpendicular to each other and includes the central axis of the beam are made apart from each other.

The linear beam spot is rotated by adjusting the strength and direction of a magnetic field generated by the pair of coils.

while changing at least one of the two focal points, the electron beam spot is moved over the pattern surface on the specimen a plurality of times to generated reflected electron signals. According to the maximum differential value of the reflected electron signals, the width of the linear beam spot is set to the minimum.

Similarly, the linear beam spot is moved over the pattern surface of the specimen a plurality of times while being automatically rotated, to produce the reflected electron signals. The maximum differential value of the reflected electron signals is detected to accurately align the longer side of the linear beam spot with the pattern edge.

Further, the same pattern portion is scanned two or more times and the measured values of the pattern width and pattern edge position are averaged to reduce measurement errors.

BRIEF DESCRIPTION OF THE DRAWINGS

FIGS. 2A and 2B are schematic diagrams showing how the pattern is measured with the electron beam;

FIGS. 3A and 3B are schematic diagrams showing how the linear beam spot is produced;

DETAILED DESCRIPTION OF PREFERRED EMBODIMENTS

Figure 1:
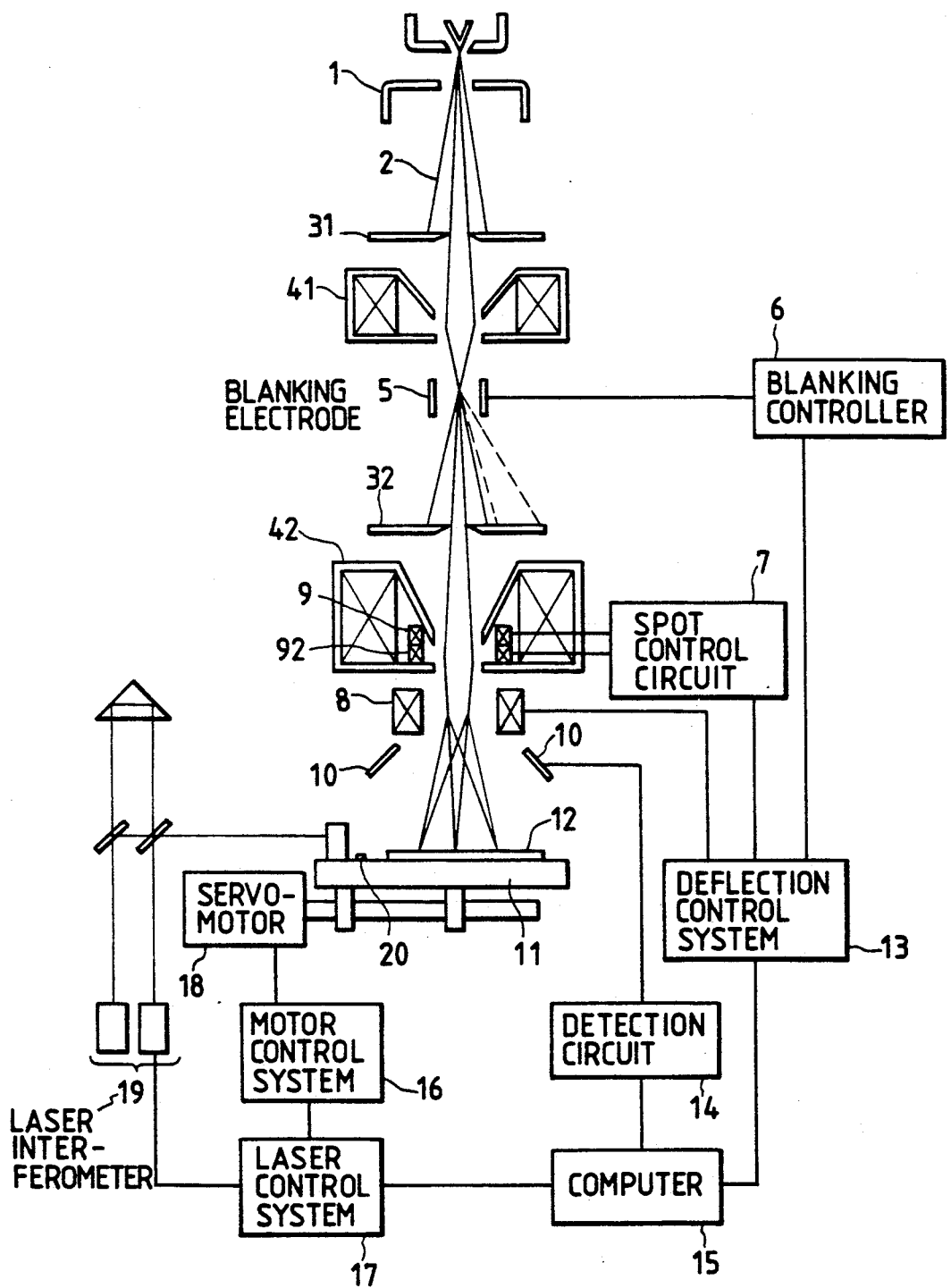
FIG. 1 is a schematic diagram showing the configuration of an electron beam measuring apparatus as an embodiment of this invention.

FIG. 1 shows the configuration of an embodiment of an electron beam measuring apparatus according to this invention.

An electron beam 2 emitted from an electron gun 1 is constricted by aperture 31, 32 and focused by an electron lens 41 and an object lens 42 onto the surface of a specimen 12. A spot of the electron beam 2 is shaped into an elongate spot by a spot controller 9 installed in the object lens 42 and the beam spot direction is set by a rotation coil 92. The beam is deflected by a deflector 8. A blanking electrode 5 can stop the irradiation of the electron beam.

The electrons reflected from the specimen 12 are detected by a detector 10, which then converts the reflected electrons into scan position signals $S_1$, $S_2$ as shown in FIG. 2B and feeds them to a computer 15.

The computer 15 sends a blanking command signal through a deflection control system 13 to a blanking controller 6 to control the banking electrode 5, supplies a spot signal to a spot control circuit 7 to control the spot controller 9, and sends a direction signal to a rotation coil 92 to control the direction of the elongate beam spot. The computer 15 also sends a deflection signal to the deflector 8 to deflect the electron beam.

Further, the computer 15 sends a control signal to a laser control system 17 to drive a servo motor 18 through a motor control system 16 to move a stage 11 in two X and Y directions and thereby set the specimen 12 within a range of electron beam irradiation. The position of the stage 11 is detected by a laser interferometer 19 and fed back through the laser control system 17 and the motor control system 16 to the servo motor 18 to precisely control the stage position.

Next, a means employed in this embodiment shown in FIG. 1 for shaping the spot of the electron beam 2 into a linear beam spot is described below.

FIGS. 3A and 3B illustrate the process of shaping the beam spot into a linear one and changing the direction of the spot. Numeral 91 is a spot control coil in the spot controller 9 to shape the beam spot into a linear form. 92 is a rotation coil to rotate the linear beam spot.

First, the spot control coil 91 in the spot controller 9 adjusts the electron beam 2 so that the electron beam has different focal points on the surface of the specimen 12 in the X and y directions. That is, the electron beam 2 is given astigmatism.

As shown in FIG. 3A, when the electron beam is focused on the surface of the specimen 12 in the Y direction of the beam indicated by a solid line, the focal point in the X direction lines before the specimen surface as indicated by dotted lines because of the astigmatism, forming a laterally oblong spot which is narrow in the Y direction and wide in the X direction.

Similarly, as shown in FIG. 3B, when the electron beam is focused on the surface of the specimen 12 in the X direction indicated by the dotted line, the focal point in the Y direction of the spot lies before the specimen surface as indicated by the solid line, forming a vertically oblong spot which is narrow in the X direction and wide in the Y direction.

Figure 4A:
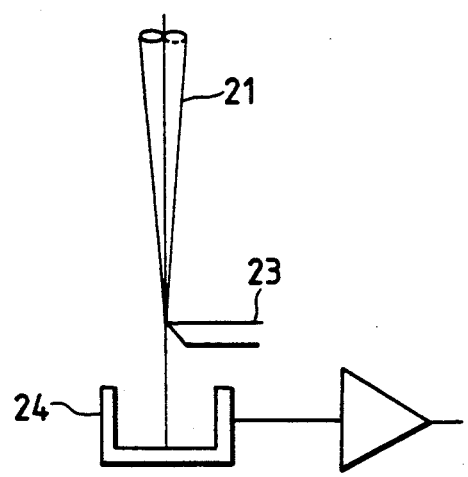
FIGS. 4A, 4B and 4C are schematic diagrams showing how the width of the linear beam spot is measured and also showing signal waveforms.
Figure 4B:
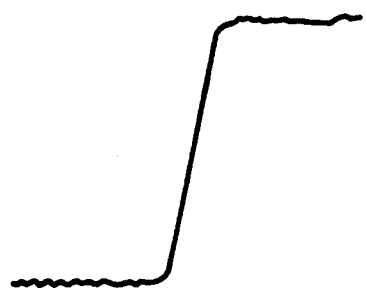
Figure 4C:

It is necessary to actually measure the width of the linear beam for confirmation. For this purpose a method shown in FIG. 4A is used for measurement. When the linear beam spot 21 is deflected to scan a Faraday cup 24, it is obstructed by a knife edge 23 located in the middle of the scan stroke. As a result, the beam current detected by the Faraday cup 24 changes as shown in FIG. 4B. FIG. 4C shows a waveform of the differentiated beam current. According to the fact that the narrower the width of the elongate beam 21, the larger the amplitude m of the differential waveform, it is possible to determine the width of the linear beam 21.

According to this invention, a linear beam spot of about 0.1 μm wide and 1 μm long was obtained.

Next, the linear beam 21 obtained in the above process is rotated by the rotation coil 92 until it matches with a specified scanning direction.

Figure 5A:
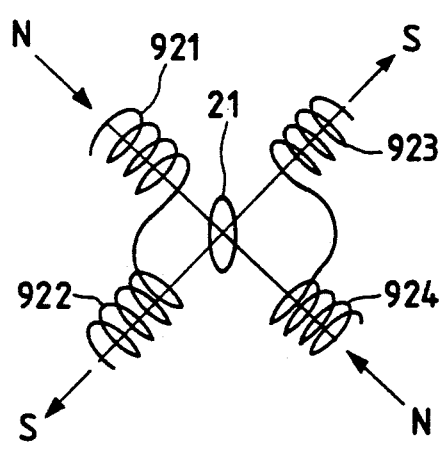
FIGS. 5A and 5B are schematic diagrams showing how the linear beam spot is rotated by the rotation coils of this invention.
Figure 5B:
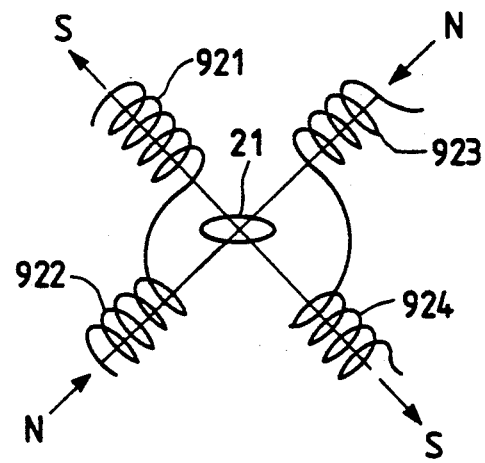

FIGS. 5A and 5B show a principal configuration of the rotation coil 92 made up of rotation coils 921, 922, 933, 924 for adjusting the direction of the linear beam spot 21 and also shows the relationship between the coil current and the direction of the linear beam spot 21.

These four coils 921-924 are energized to produce magnetic fields having their directions indicated by arrows. In the case of FIG. 5A, the linear beam spot 21 is aligned vertically and in FIG. 5B aligned horizontally. N and S represent the polarity of the magnetic fields at the end of each coil. Changing the direction and intensity of the magnetic field of each coil makes it possible to set the direction of the linear beam spot 21 at any desired angle.

While the rotation coil 92 shown in FIGS. 5A and 5B have four rotation coils 921-924 in FIGS. 5A and 5B, practically eight or more rotating coils may be used to prevent variations in the center position and shape of the beam spot that may result from the beam spot rotation.

Then the direction of the linear beam spot 21 is aligned with the scanning direction $\theta$, followed by the final adjustment of the spot adjusting coil to minimize the width of the elongate beam 21.

Figure 6A:
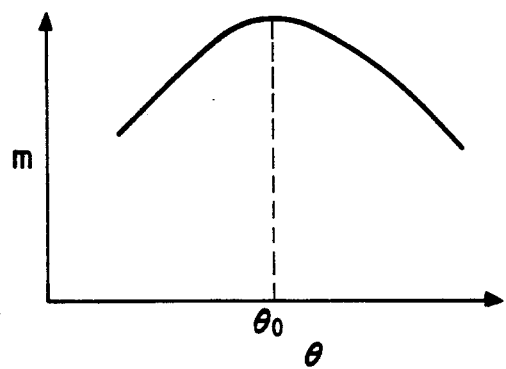
FIGS. 6A and 6B are graphs showing the measured data of the linear beam width.

The direction of the linear beam spot 21 can also be checked by the method shown in FIG. 4A. With the knife edge 23 disposed in a specified direction $\theta_0$, the scanning direction 74 of the linear beam spot 21 is changed. Since, as shown in FIG. 6A, the value m becomes maximum when the $\theta$ coincides with the $\theta_0$, it is possible to set the scanning direction $\theta$ of the linear beam spot 21 to the $\theta_0$.

Figure 6B:
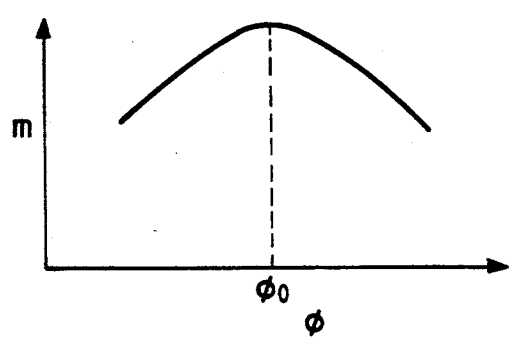

After the above adjustment is made of the $\theta$, the width of the beam spot is finally adjusted by the measuring method using the knife edge. FIG. 6B shows an example of a variation characteristic of the value m with respect to the amount of adjustment $\phi$ made to the spot control coil 91. As seen from the figure, the amplitude m reaches a maximum at $\phi_0$, at which the width of the linear beam spot 21 becomes narrowest. So the amount $\phi$ is fixed to this $\phi_0$.

There is another method of adjusting the linear beam spot width and direction using the pattern edge in place of the knife edge 23. In this case, the reflected electron signal from the pattern edge, like the one shown in FIG. 2B, is differentiated to allow adjustment of the width and direction of the beam spot 21 according to the maximum value of the magnitude m. This method offers an advantage of not having to install inside the vacuum vessel a mechanism for setting the direction of the knife edge 23. Furthermore, since the electron beam is defocused at the initial stage of adjustment, which makes its electron density low, and thereafter is formed into a linear spot, the pattern can be protected from being damaged during this adjustment process.

Figure 7:
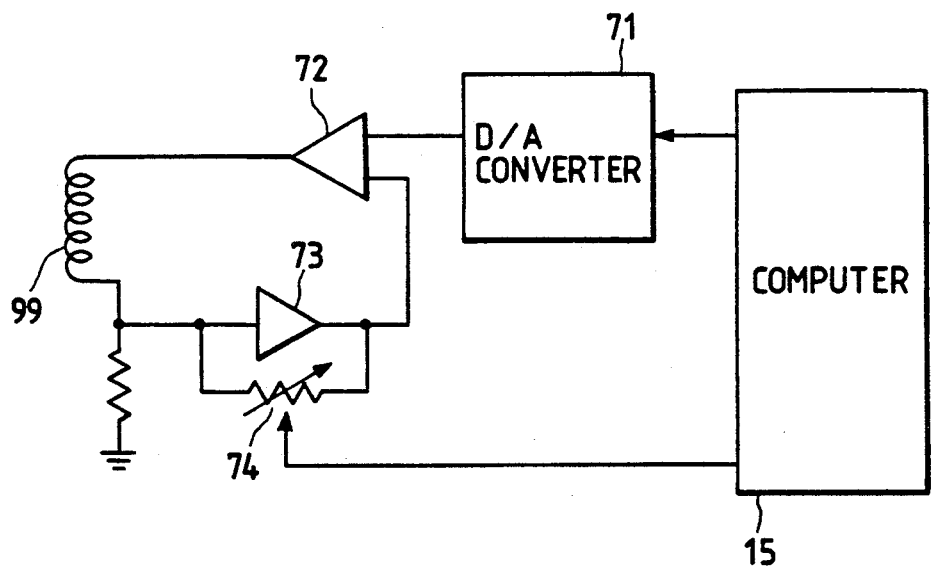
FIG. 7 is a diagram of a current control circuit for the electron beam shaping coil.

FIG. 7 shows an example of a circuit configuration that sets the value of a current applied to the spot adjusting coil 91 and the rotation coil 92. These coils are representatively designated by numeral 99. The computer 15 outputs a current optimum value for the coils 99 to a digital-to-analog (DA) converter 71, which converts the current optimum value into an analog voltage and feeds it to a drive amplifier 72 to drive the coils 99. The current of the coils 99 is by a current detection amplifier 73 and fed back to the drive amplifier 72 where it is compared with the output voltage of the DA converter 71.

When the current optimum value needs to be adjusted, the computer 15 issues an adjusting signal to adjust the resistance of a current detection resistor 74 for the current detection amplifier 73.

The result of the above adjustment is stored in the computer 15 of FIG. 1, which retrieves this stored data for each pattern dimension measuring process and updates them when necessary.

What is stored in the computer memory includes, for example, the drive current value for the spot control coil 91 for giving a specified astigmatism, explained in FIGS. 3A and 3B, to the electron beam 2; the shape information such as width and length of the linear beam spot 21 obtained; and the drive current value for the rotation coil 92 to rotate the linear beam spot 21 through a specified angle. These information also includes the coil drive current values corresponding to $\theta_0$ and $\phi_0$ of the characteristic curves of FIGS. 6A and 6B that are obtained by using the apparatus of FIG. 4 or the pattern on the specimen.

The current of the rotation coil 92 and the current of the spot control coil 91 are swept so as to includes $\theta_0$ and $\phi_0$ of the characteristic curves of FIGS. 6A and 6B, and the values m measured during this scanning process are compared to detect the maximum value, thus determining the setting currents of these coils.

Since the shapes of the characteristic curves of FIGS. 6A and 6B can be known beforehand, it is also possible to calculate, from the m values before and after the $\theta_0$ and $\phi_0$, the drive current values of each coil that correspond to $\theta_0$ and $\phi_0$.

The command for sweeping the currents for the rotation coil 92 and the spot control coil 91 in a specified range is generated by the computer 15 of FIG. 1, which also performs the calculation to determine the maximum value of m.

Figure 8A:
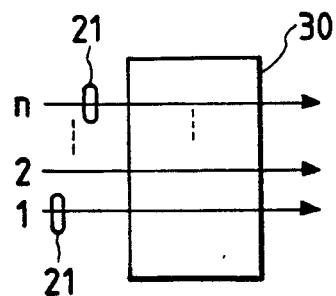
FIGS. 8(A-B) and 9 are schematic diagrams showing a method of improving the accuracy of measuring the patterns by using a linear beam of the invention.
Figure 8B:
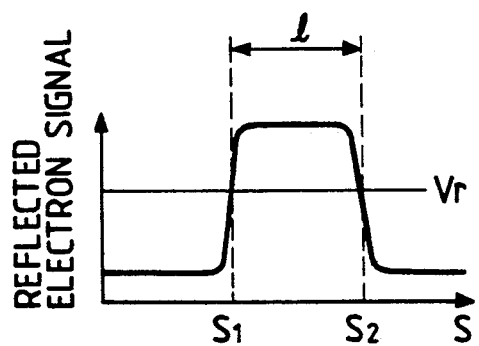
Figure 9:
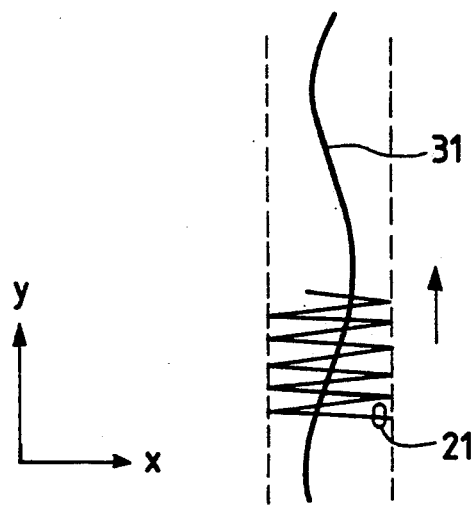

FIGS. 8 and 9 illustrate a method of improving the accuracy of measurement using the linear beam spot 21.

In FIG. 8A, the linear beam spot 21 is moved over the same pattern width a plurality of times (n times). The measured widths ( in FIG. 8B obtained by each scanning are added and divided by the number of sweeping operations to take an arithmetic mean, which reduces the measuring errors that may result from incomplete linearity of edges or winding edges of the pattern.

FIG. 9 shows another method of improving the measuring precision, in which the linear beam spot 21 is rapidly moved back and forth along the pattern edge 31 and the edge position signals are arithmetically averaged to improve the accuracy.

In this invention, the electron beam spot is shaped into an elongate one and its direction changed by the spot controller and the rotation coil, both constituting an astigmatism coil and installed in the object lens of the electron beam measuring apparatus. This construction does not require a rectangular aperture used in the conventional apparatus and at the same time obviates the associated maintenance work such as mounting and dismounting the rectangular aperture, adjusting the aperture position and cleaning.

Another advantage of this invention is that since there is no need to mount the rectangular aperture and the position adjusting mechanism in the vacuum vessel of the electron beam, the vacuum is prevented from being contaminated. Since the spot controller and the rotation coil are installed in the object lens, this invention can very easily be applied to conventional electron beam measuring apparatus.

Further, the linear beam spot width is automatically set to the minimum by the pattern edge detection process and at the same time the longer side of the linear beam spot is automatically disposed to face the pattern edge, thus reducing the adjusting time and error. During this adjustment process, the specimen is not contaminated by the electron beam applied.

Moreover, the same pattern portion is scanned two or more times and the measured widths are averaged to reduce measurement errors that may result from incomplete linearity of pattern or edges winding pattern edges.

We claim:

1. An electron beam measuring apparatus for measuring the size of a pattern on a surface of a specimen comprising,
   an electron gun for emitting an electron beam,
   an electron lens for focusing the electron beam on the specimen surface,
   a deflector for deflecting the electron beam so as to scan the pattern with the electron beam,
   a spot control means for controlling the shape of the electron beam spot according to the direction of scanning of the electron beam,
   detecting means for detecting secondary electrons from the specimen surface, and
   a computer for calculating the size of the pattern based on the secondary electrons from the detecting means.

2. An electron beam measuring apparatus as defined in claim 1, characterized in that,
   said spot control means controls the focus of the electron beam so as to form a flat edge portion in the electron beam spot which is perpendicular to the scanning direction.

3. An electron beam measuring apparatus as defined in claim 1, characterized in that,
   said spot control means rotates the electron beam so as to set the electron beam spot at a rotational position in which differential signal of the secondary electrons from the detecting means becomes largest when the electron beams spot scan the pattern.

4. An electron beam measuring apparatus as defined in claim 1, characterized in that, said computer calculates the size of the pattern based on average value of pattern edges calculated from the secondary electrons when the pattern edge is scanned plural times.

5. An electron beam measuring apparatus for measuring the size of a pattern on a surface of a specimen comprising, an electron gun for emitting an electron beam, an electron lens for focusing the electron beam on the specimen surface, a deflector for deflecting the electron beam so as to scan the pattern with the electron beam, a spot shape control means for controlling the shape of the electron beam spot, a rotation coil for rotating the electron beam so that the flat portion of the electron beams pot becomes to be perpendicular to the scanning direction of the electron beam, detecting means for detecting secondary electrons from the specimen surface, and a computer for calculating the size of the pattern based on the secondary electrons from the detecting means.

6. An electron beam measuring apparatus as defined in claim 5, characterized in that, said spot shape control means controls the focus of the electron beam so as to form the flat portion in the electron beam.

7. An electron beam measuring apparatus as defined in claim 5, characterized in that, said rotation coil comprises a pair of coils for emitting a magnetic field so as to rotate the electron beam at a central axis thereof.

8. An electron beam measuring apparatus as defined in claim 5, characterized in that, said rotation coil rotates the electron beam so as to set the electron beam spot at a rotational position in detecting means becomes the largest when the electron beam spot scans the pattern.

9. An electron beam measuring apparatus as defined in claim 5, characterized in that, said computer calculates the size of the pattern based on average value of pattern edges obtained from the secondary electrons when the pattern edge is scanned plural times.

* * * * *